US012796093B2

(12) United States Patent
Liu et al.

(10) Patent No.: US 12,796,093 B2
(45) Date of Patent: Nov. 10, 2026

(54) ARRAY SUBSTRATE WITH PIXEL UNITS HAVING THIN-FILM TRANSISTORS LOCATED BETWEEN MAIN PIXEL SUB-REGIONS AND DISPLAY PANEL COMPRISING THE SAME

(71) Applicant: TCL CHINA STAR OPTOELECTRONICS TECHNOLOGY CO., LTD., Shenzhen (CN)

(72) Inventors: Jinming Liu, Shenzhen (CN); Fan Gao, Shenzhen (CN); Shuang Wang, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 488 days.

(21) Appl. No.: 18/399,483

(22) Filed: Dec. 28, 2023

(65) Prior Publication Data

US 2025/0176264 A1 May 29, 2025

(30) Foreign Application Priority Data

Nov. 24, 2023 (CN) ......................... 202311584914.2

(51) Int. Cl.
*H10D 86/60* (2025.01)
*G02F 1/1343* (2006.01)
(Continued)

(52) U.S. Cl.
CPC ....... *H10D 86/60* (2025.01); *G02F 1/134309* (2013.01); *G02F 1/134345* (2021.01);
(Continued)

(58) Field of Classification Search
CPC ............. G02F 1/1362; G02F 1/134345; G02F 1/1368; G02F 1/13624; G02F 1/136245;
(Continued)

(56) References Cited

U.S. PATENT DOCUMENTS

2016/0202575 A1* 7/2016 Youk ................ G02F 1/134336 349/110
2016/0370636 A1* 12/2016 Huang ............. G02F 1/134309
(Continued)

*Primary Examiner* — Younes Boulghassoul
(74) *Attorney, Agent, or Firm* — HSML P.C.

(57) ABSTRACT

An array substrate and a display panel are provided. The array substrate includes a base substrate, multiple pixel units, a scan line extending in a first direction, and a first-type signal line extending in a second direction. Each pixel unit includes a main pixel region and a sub-pixel region, and includes thin-film transistors. The scan line is arranged between the main pixel region and the sub-pixel region, and the first-type signal line and the thin-film transistors are placed between the first and second main pixel sub-regions, so a light-blocking area of the signal lines is reduced in the array substrate, and an aperture ratio of the array substrate is increased. This leads to an enhancement in a light transmission rate of the display panel using this array substrate, while also reducing manufacturing costs and power consumption.

20 Claims, 7 Drawing Sheets

(51) Int. Cl.
*G02F 1/1362* (2006.01)
*G02F 1/1368* (2006.01)
*H10D 86/40* (2025.01)

(52) U.S. Cl.
CPC ...... *G02F 1/1362* (2013.01); *G02F 1/136286* (2013.01); *G02F 1/1368* (2013.01); *H10D 86/441* (2025.01); *H10D 86/443* (2025.01)

(58) Field of Classification Search
CPC ........................ G02F 1/134309–134354; G02F 1/136286–136295; H10D 86/60; H10D 86/441; H10K 59/123
See application file for complete search history.

(56) References Cited

U.S. PATENT DOCUMENTS

| | | | | |
|---|---|---|---|---|
| 2017/0162140 | A1* | 6/2017 | Kim | G09G 3/2003 |
| 2017/0192317 | A1* | 7/2017 | Song | G02F 1/13306 |
| 2018/0157104 | A1* | 6/2018 | Kim | G02F 1/133555 |
| 2018/0299734 | A1* | 10/2018 | Gan | G02F 1/133753 |
| 2018/0329241 | A1* | 11/2018 | Wang | G02F 1/136213 |
| 2019/0146292 | A1* | 5/2019 | Woo | G02F 1/134309 349/139 |
| 2019/0243198 | A1* | 8/2019 | Lee | G02F 1/133707 |
| 2021/0325715 | A1* | 10/2021 | Lee | G02F 1/136286 |
| 2021/0333656 | A1* | 10/2021 | Zhang | G02F 1/1368 |
| 2021/0364869 | A1* | 11/2021 | Lv | G02F 1/134363 |
| 2021/0405486 | A1* | 12/2021 | Zhao | G02F 1/1368 |
| 2022/0357623 | A1* | 11/2022 | Xu | G02F 1/134345 |
| 2023/0109769 | A1* | 4/2023 | Zhang | G02F 1/1337 349/42 |
| 2024/0038774 | A1* | 2/2024 | Gao | H10D 86/441 |
| 2024/0045289 | A1* | 2/2024 | Xu | G02F 1/136222 |
| 2024/0069391 | A1* | 2/2024 | Lu | H10D 86/481 |
| 2024/0142828 | A1* | 5/2024 | Wu | G02F 1/134309 |

* cited by examiner

ARRAY SUBSTRATE WITH PIXEL UNITS HAVING THIN-FILM TRANSISTORS LOCATED BETWEEN MAIN PIXEL SUB-REGIONS AND DISPLAY PANEL COMPRISING THE SAME

FIELD OF DISCLOSURE

The present disclosure relates to a field of display technology and in particular, to an array substrate and a display panel.

DESCRIPTION OF RELATED ART

Currently, as shown in FIG. 1, an array substrate 100' is controlled by a row of horizontally extending scan lines 105' to control a row of pixel units. A column of vertically extending data lines 113' provides data signals for a column of pixel units to achieve independent control of the pixel units. Additionally, a vertically extending shared electrode line (sharebar) 112' runs through each pixel unit's main pixel region 103' and sub-pixel region 104'. Because the areas corresponding to the scan lines, data lines, shared electrode lines, and other signal lines are opaque, this results in a reduced light-transmissive area in the pixel units of the array substrate and a lower aperture ratio of the array substrate, leading to a technical problem where it is difficult to improve the transparency of display panels that use the array substrate.

At the same time, different from the aforementioned array substrate with a row of horizontally extending scan lines and a column of vertically extending data lines controlling pixel units, where pixel units of different colors are alternately arranged horizontally in a single-gate type array substrate, a tri-gate type array substrate arranges pixel units of different colors alternately in a vertical direction. With the same resolution, it can achieve lower cost and lower power consumption. However, the number of scan lines in the tri-gate type array substrate is three times that of the single-gate type array substrate with the same resolution. The scan lines are arranged between the pixel units, which also results in a reduced aperture ratio of the tri-gate type array substrate, presenting a technical problem where it is difficult to improve the transparency of display panels that use the tri-gate type array substrate.

Therefore, there is an urgent need to provide an array substrate and a display panel to solve the aforementioned technical problems.

SUMMARY OF DISCLOSURE

The present disclosure provides an array substrate and a display panel that can alleviate the technical problem of a small light-transmissive area in the pixel units of the current array substrates, which makes it difficult to improve the transparency of display panels that use these array substrates.

The present disclosure provides an array substrate, including: a base substrate, a plurality of pixel units disposed on one side of the base substrate, a plurality of pixel units disposed on the base substrate, a scan line extending in a first direction, and a first-type signal line extending in a second direction intersecting with the first direction.

Each of the pixel units includes a main pixel region and a sub-pixel region. Each of the pixel units also includes a pixel electrode located in the main pixel region and the sub-pixel region. The scan line is located between the main pixel region and the sub-pixel region. The main pixel region includes a first main pixel sub-region and a second main pixel sub-region arranged along the first direction. The sub-pixel region includes a first sub-pixel sub-region and a second sub-pixel sub-region arranged along the first direction. The first main pixel sub-region and the first sub-pixel sub-region are arranged along the second direction, and the second main pixel sub-region and the second sub-pixel sub-region are arranged along the second direction. The first-type signal line is located between the first main pixel sub-region and the second main pixel sub-region.

Each pixel unit further includes multiple thin-film transistors. The thin-film transistors are electrically connected to the scan line and the first-type signal line and located between the first main pixel sub-region and the second main pixel sub-region. The pixel electrode in the first main pixel sub-region and the pixel electrode in the second main pixel sub-region are connected to a same one of the thin-film transistors, and the pixel electrode in the first sub-pixel sub-region and the pixel electrode in the second sub-pixel sub-region are connected to a same one of the thin-film transistors.

In some embodiments, the array substrate further includes a plurality of data lines extending in the second direction. The pixel electrode includes a first main trunk electrode extending in the second direction, an orthographic projection of the first main trunk electrode projected on the base substrate is at least partially within an orthographic projection of the data lines projected on the base substrate.

In some embodiments, the first main trunk electrode includes a first sub-section located in the first main pixel sub-region, a second sub-section located in the second main pixel sub-region, a third sub-section located in the first sub-pixel sub-region, and a fourth sub-section located in the second sub-pixel sub-region.

The data lines include a first-type data line and a second-type data line. An orthographic projection of the first sub-section projected on the base substrate is at least partially within an orthographic projection of the first-type data line projected on the base substrate, an orthographic projection of the third sub-section projected on the base substrate is at least partially within the orthographic projection of the first-type data line projected on the base substrate, an orthographic projection of the second sub-section projected on the base substrate is at least partially within an orthographic projection of the second-type data line projected on the base substrate, and an orthographic projection of the fourth sub-section projected on the base substrate is at least partially within the orthographic projection of the second-type data line projected on the base substrate.

In some embodiments, the pixel units include a plurality of first pixel units and a plurality of second pixel units, the first pixel units and the second pixel units are alternately arranged along the second direction, the first pixel units are electrically connected to the first-type data line, the second pixel units are electrically connected to the second-type data line, and the array substrate also includes a first common electrode line. A voltage difference between the first-type data line and the first common electrode line is of opposite polarity to a voltage difference between the second-type data line and the first common electrode line.

In some embodiments, the first-type signal line is a shared electrode line.

In some embodiments, the array substrate further includes a shared electrode line, wherein the shared electrode line surrounds the pixel unit.

In some embodiments, the array substrate further includes a first common electrode line, extending in the first direction, the first common electrode line and the scan line in a same layer and spaced apart. The first common electrode line includes a first sub-part and a second sub-part arranged along the second direction, and the first sub-part and the second sub-part are respectively located on two opposite sides of the pixel unit.

In some embodiments, the shared electrode line surrounds the pixel unit, the shared electrode line includes a third sub-part and a fourth sub-part arranged along the second direction, and the third sub-part and the fourth sub-part extend along the first direction. The third sub-part and the fourth sub-part are respectively located on two opposite sides of the pixel unit, an orthographic projection of the third sub-part projected on the base substrate is at least partially within an orthographic projection of the first sub-part projected on the base substrate, and an orthographic projection of the fourth sub-part projected on the base substrate is at least partially within an orthographic projection of the second sub-part projected on the base substrate.

In some embodiments, the first-type signal line is a data line.

According to some embodiments, in each of the pixel units, the thin-film transistors are located on one side of the first-type signal line close to the first main pixel sub-region, or the thin-film transistors are located on one side of the first-type signal line close to the second main pixel sub-region;

the thin-film transistors include a first thin-film transistor, a second thin-film transistor, and a third thin-film transistor;

a gate of the first thin-film transistor is electrically connected to the scan line, a source of the first thin-film transistor is electrically connected to the data line, and a drain of the first thin-film transistor is electrically connected to the pixel electrode in the main pixel region;

a gate of the second thin-film transistor is electrically connected to the scan line, a source of the second thin-film transistor is electrically connected to the data line, and a drain of the second thin-film transistor is electrically connected to the pixel electrode in the sub-pixel region; and a gate of the third thin-film transistor is electrically connected to the scan line, a source of the third thin-film transistor is electrically connected to the drain of the second thin-film transistor, and a drain of the third thin-film transistor is electrically connected to the shared electrode line.

In some embodiments, the scan line, the gate of the first thin-film transistor, the gate of the second thin-film transistor, and the gate of the third thin-film transistor are integrally formed.

The present disclosure further provides a display panel. The display panel includes the array substrate mentioned above.

In the present disclosure, the scan line is arranged between the main pixel region and the sub-pixel region, and the first-type signal line and the thin-film transistors are placed between the first and second main pixel sub-regions, so a light-blocking area of the signal lines is reduced in the array substrate, and an aperture ratio of the array substrate is increased. This leads to an enhancement in a light transmission rate of the display panel using this array substrate, while also reducing manufacturing costs and power consumption.

BRIEF DESCRIPTION OF DRAWINGS

To more clearly illustrate the technical solutions in the embodiments of the present disclosure, the following will provide a simple introduction to the drawings necessary for the description of the embodiments. It is evident that the drawings described below are only some embodiments of this application. For those skilled in the art, other drawings can be obtained based on these drawings without creative efforts.

DETAILED DESCRIPTION OF EMBODIMENTS

Figure 1:
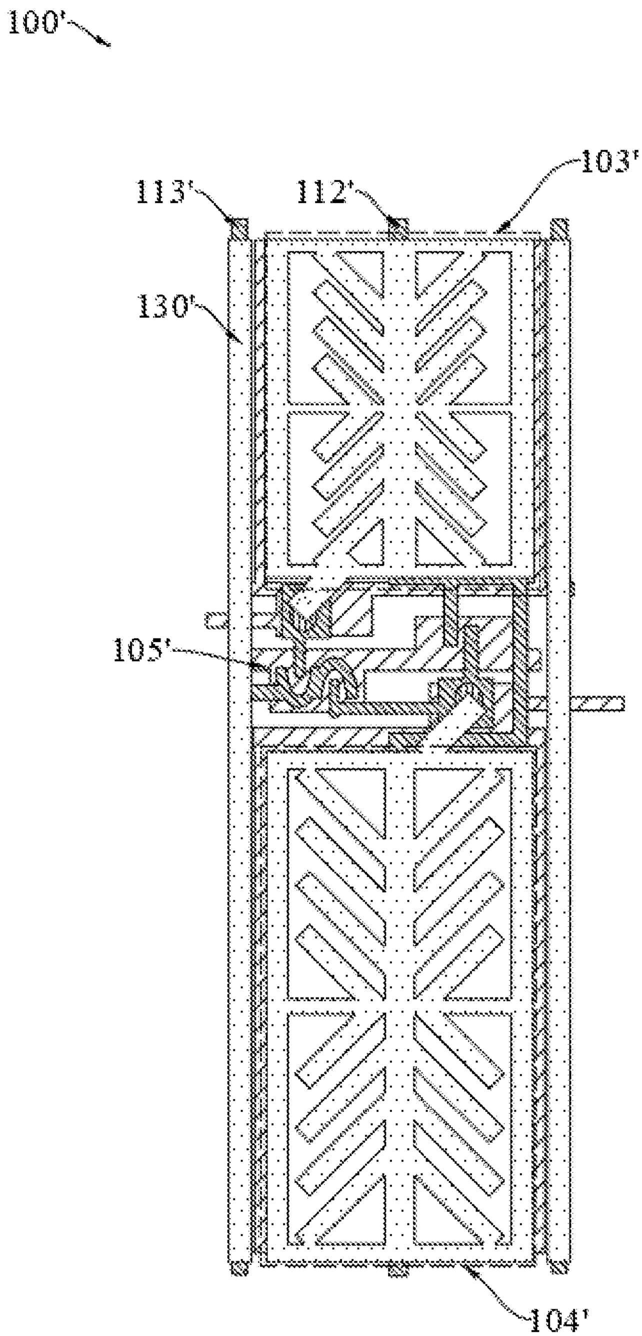
FIG. 1 is a schematic structural view of a conventional array substrate.
Figure 2:
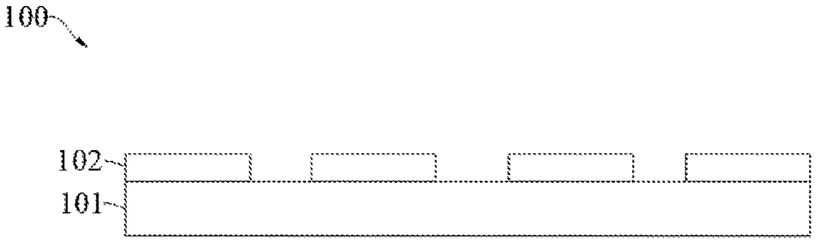
FIG. 2 is a schematic structural view of an array substrate according to one embodiment of the present disclosure.

The following describes the technical solutions in the embodiments of this application clearly and completely, in conjunction with the accompanying drawings of the embodiments. Obviously, the described embodiments are just some of the embodiments, not all of them. Based on these embodiments of the application, all other embodiments obtained by those skilled in the field without creative work also fall within the protection scope of this application. Furthermore, it should be understood that the specific implementation methods described here are only for illustrating and explaining this application and are not intended to limit the application. In this application, unless stated otherwise, orientation terms such as "up" and "down" typically refer to the direction in the actual use or working state of the device, specifically the direction shown in the drawings; "inside" and "outside" refer to the outline of the device.

Currently, due to the non-transparent areas corresponding to scan lines, data lines, shared electrode lines, and other signal lines, pixel units in an array substrate have a small light-transmissive area and a low aperture ratio, presenting a technical problem in improving the light transmission rate of display panels using the array substrate.

Referring to FIGS. 2 to 11, the application provides an array substrate 100, including:

a base substrate 101;

a plurality of pixel units 102, disposed on one side of the base substrate 101, each pixel unit 102 including a main pixel region 103 and a sub-pixel region 104, each pixel unit 102 also containing a pixel electrode 114 located within the main pixel region 103 and the sub-pixel region 104;

a scan line 105 extending in a first direction X, located between the main pixel region 103 and the sub-pixel region 104; and a first-type signal line 106 extending in a second direction Y, intersecting with the first direction X;

wherein the main pixel region 103 includes a first main pixel sub-region 107 and a second main pixel sub-region 108 arranged along the first direction X, the sub-pixel region 104 includes a first sub-pixel sub-region 109 and a second sub-pixel sub-region 110 arranged along the first direction X, the first main pixel sub-region 107 and the first sub-pixel sub-region 109 are arranged along the second direction Y, and the second main pixel sub-region 108 and the second sub-pixel sub-region 110 are arranged along the second direction Y;

the first-type signal line 106 located between the first main pixel sub-region 107 and the second main pixel sub-region 108;

each pixel unit 102 also includes thin-film transistors 111, the thin-film transistors 111 are electrically connected to the scan line 105 and the first-type signal line 106, and the thin-film transistors are located between the first main pixel sub-region 107 and the second main pixel sub-region 108.

The embodiment of this application provides an array substrate 100, which can be a tri-gate array substrate. By setting the scan line 105 between the main pixel region 103 and the sub-pixel region 104, the occupation of a light-transmissive area by the scan line 105 is reduced. Compared to the existing tri-gate array substrates, this effectively increases the aperture ratio; simultaneously, compared to the existing single-gate array substrates, it achieves an effective increase in aperture ratio while reducing costs and power consumption.

In this embodiment, by setting the scan line 105 between the main pixel region 103 and the sub-pixel region 104, and placing the first-type signal line 106 and the thin-film transistors 111 between the first main pixel sub-region 107 and the second main pixel sub-region 108, the occupation of the light-transmissive area by the signal lines in the array substrate 100 is reduced. This increases the light-transmissive area of the pixel units 102, enhances the aperture ratio of the array substrate 100, and increases the light transmittance of the display panel using the array substrate 100 while reducing its manufacturing costs and power consumption.

In conjunction with specific embodiments, this application describes a technical solution as follows.

Please refer to FIGS. 3, 7 to 11. In this embodiment, the scan line 105 is positioned between the main pixel region 103 and sub-pixel region 104, between the first main pixel sub-region 107 and the first sub-pixel sub-region 109, and also between the second main pixel sub-region 108 and the second sub-pixel sub-region 110.

The first-type signal line 106, when positioned between the first main pixel sub-region 107 and the second main pixel sub-region 108, is also located between the first sub-pixel sub-region 109 and the second sub-pixel sub-region 110.

The thin-film transistors (TFT) 111, when located between the first main pixel sub-region 107 and the second main pixel sub-region 108, are also positioned between the first sub-pixel sub-region 109 and the second sub-pixel sub-region 110. In each pixel unit 102, the thin-film transistors 111 can be positioned on one side of the first-type signal line 106 closer to the first main pixel sub-region 107, or alternatively, the thin-film transistors 111 can be located on one side of the first-type signal line 106 closer to the second main pixel sub-region 108.

Please refer to FIGS. 3, and 7 to 11. In some embodiments, the thin-film transistor (TFT) 111 includes a first TFT T1, a second TFT T2, and a third TFT T3. A gate of the first TFT T1 is electrically connected to the scan line 105, a source of the first TFT T1 is electrically connected to a data line 113, and a drain of the first TFT T1 is electrically connected to the pixel electrode 114 in the main pixel region 103. A gate of the second TFT T2 is electrically connected to the scan line 105, a source of the second TFT T2 is electrically connected to the data line 113, and a drain of the second TFT T2 is electrically connected to the pixel electrode 114 in the sub-pixel region 104. A gate of the third TFT T3 is electrically connected to the scan line 105, a source of the third TFT T3 is electrically connected to the drain of the second TFT T2, and a drain of the third TFT T3 is electrically connected to the shared electrode line 112. The first TFT T1 controls the pixel electrode 114 in the main pixel region 103, while the second TFT T2 and the third TFT T3 together control the pixel electrode 114 in the sub-pixel region 104, enabling different potentials for the pixel electrode 114 in the main pixel region 103 and the pixel electrode 114 for the sub-pixel region 104, thus independently controlling the bias of the pixel electrode 114 in the sub-pixel region 104. This helps reduce color shifts in the display panel using the array substrate 100 and improves the display quality of the display panel.

In some embodiments, the first direction X can be a row direction, and the second direction Y can be a column direction. Each row of the pixel units 102 is electrically connected to the same scan line 105.

Referring to FIGS. 3, and 7 to 9, in some embodiments, the first-type signal line 106 is a shared electrode line 112. By setting the shared electrode line 112 between the first main pixel sub-region 107 and the second main pixel sub-region 108, compared to extending the shared electrode line 112 into the main pixel region 103 and sub-pixel region 104, the occupation of the light-transmissive area by the shared electrode line 112 in the pixel unit 102 is reduced. This increases the aperture rate of the array substrate 100 and thereby enhances the light transmittance of the display panel using the array substrate 100.

In some embodiments, the array substrate 100 further includes a plurality of data lines 113 extending along the second direction Y. The thin-film transistors 111 are electrically connected to the data lines 113. In this case, the first-type signal line 106 can be the shared electrode line 112.

Each of the pixel units 102 includes the pixel electrode 114. The pixel electrode 114 is located within the main pixel region 103 and the sub-pixel region 104. The pixel electrode 114 includes a main pixel electrode located in the main pixel region 103, and a sub-pixel electrode located in the sub-pixel region 104.

In some embodiments, the pixel electrode 114 includes a first main trunk electrode 115 extending in the second direction Y. An orthographic projection of the first main trunk electrode 115 projected on the base substrate 101 is at least partially within an orthographic projection of the data line 113 projected on the base substrate 101. This arrangement reduces the light-transmissive area occupied by the data line 113 on the array substrate 100, thereby enhancing the aperture ratio of the array substrate 100.

In some embodiments, an orthographic projection of the first main trunk electrode 115 projected on the base substrate 101 is within the orthographic projection of the data line 113 on the base substrate 101. Alternatively, part of the data line 113 within the pixel unit 102 may have its orthographic projection on the base substrate 101 within the orthographic projection of the first main trunk electrode 115 on the base substrate 101.

In some embodiments, the main pixel electrode includes a first main pixel electrode located within the first main pixel sub-region 107 and a second main pixel electrode within the second main pixel sub-region 108. The sub-pixel electrode includes a first sub-pixel electrode within the first sub-pixel sub-region 109 and a second sub-pixel electrode within the second sub-pixel sub-region 110.

The first main trunk electrode 115 includes a first sub-section 115*a* located in the first main pixel sub-region 107, a second sub-section 115*b* located in the second main pixel sub-region 108, a third sub-section 115*c* located in the first sub-pixel sub-region 109, and a fourth sub-section 115*d* located in the second sub-pixel sub-region 110. That is, the first main pixel electrode includes the first sub-section 115*a*, the second main pixel electrode includes the second sub-section 115*b*, the first sub-pixel electrode includes the said third sub-section 115*c*, and the second sub-pixel electrode includes the fourth sub-section 115*d*.

In some embodiments, the first sub-section 115*a* of the first main trunk electrode is projected orthographically on the base substrate 101, at least partially located within the orthographic projection of the data line 113 on the base substrate 101. Similarly, the third sub-section 115*c* is projected orthographically on the base substrate 101, at least partially within the orthographic projection of the data line 113 on the base substrate 101.

The second sub-section 115*b* is projected orthographically on the base substrate 101, at least partially within the orthographic projection of the data line 113 on the base substrate 101, and the fourth sub-section 115*d* is also projected orthographically on the base substrate 101, at least partially within the orthographic projection of the data line 113 on the base substrate 101.

Figure 3:
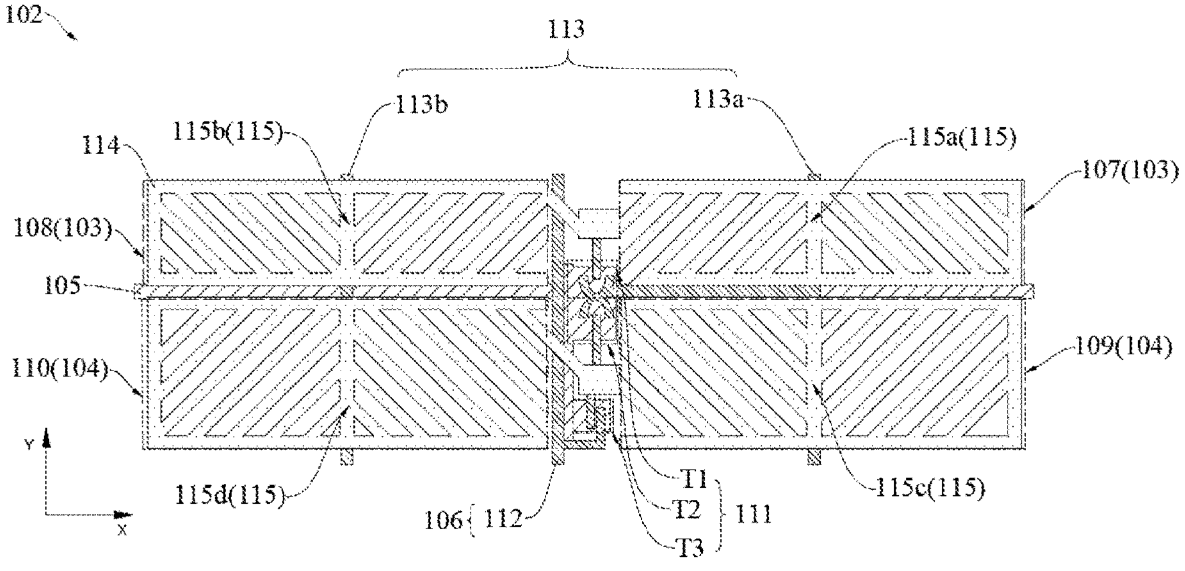
FIG. 3 is a schematic view of a first structure of a pixel unit of the array substrate according to one embodiment of the present disclosure.

Furthermore, referring to FIGS. 3 to 4, and 7 to 9, the data lines 113 include a first-type data line 113*a* and a second-type data line 113*b*. The first sub-section 115*a* is projected orthographically on the base substrate 101, at least partially within an orthographic projection of the first-type data line 113*a* on the base substrate 101, and the third sub-section 115*c* is also projected orthographically on the base substrate 101, at least partially within the orthographic projection of the first-type data line 113*a* on the base substrate 101. The second sub-section 115*b* is projected orthographically on the base substrate 101, at least partially within an orthographic projection of the second-type data line 113*b* on the base substrate 101, and the fourth sub-section 115*d* is also projected orthographically on the base substrate 101, at least partially within the orthographic projection of the second-type data line 113*b* on the base substrate 101. As an example, for large-size products such as the 75 UD type display panel, when using the array substrate 100 as shown in FIG. 3, the aperture ratio improvement is greater than 20% compared to using a conventional array substrate 100' (as shown in FIG. 1).

In some embodiments, the pixel unit 102 includes a first pixel unit 102*a* and a second pixel unit 102*b*. The first pixel unit 102*a* and the second pixel unit 102*b* are alternately arranged along the second direction Y. The first pixel unit 102*a* is electrically connected to the first-type data line 113*a*, and the second pixel unit 102*b* is electrically connected to the second-type data line 113*b*. The polarities of the first-type data line 113*a* and the second-type data line 113*b* are opposite. This means the array substrate 100 also includes a first common electrode line 118, and a voltage difference between the first-type data line 113*a* and the first common electrode line 118 is of opposite polarity to a voltage difference between the second-type data line 113*b* and the first common electrode line 118. By inputting opposite polarity signals to the first-type data line 113*a* and the second-type data line 113*b* respectively, the first-type data line 113*a* controls the polarity of the first pixel unit 102*a*, and the second-type data line 113*b* controls the polarity of the second pixel unit 102. This arrangement is beneficial for achieving single-point flipping in the column direction of the display panel using the array substrate 100, reducing the granularity of the display, and enhancing the display quality. Further, the alternate arrangement of the first pixel unit 102*a* and the second pixel unit 102*b* along both the second direction Y and the first direction X aids in reducing the granularity of the display and enhancing the display quality.

Furthermore, the first pixel unit 102*a* and the second pixel unit 102*b* are alternately arranged along the second direction Y. The first pixel unit 102*a* is electrically connected to the first-type data line 113*a*, and the second pixel unit 102*b* is electrically connected to the second-type data line 113*b*. When the first-type data line 113*a* is electrically connected to the pixel electrode 114 in the first pixel unit 102*a* to control the polarity of the first pixel unit 102*a*, the polarity of the pixel electrode 114 in the first pixel unit 102*a* is opposite to the polarity of the second-type data line 113*b*. Similarly, when the second-type data line 113*b* is electrically connected to the pixel electrode 114 in the second pixel unit 102*b* to control the polarity of the second pixel unit 102*b*, the polarity of the pixel electrode 114 in the second pixel unit 102*b* is opposite to the polarity of the first-type data line 113*a*. This arrangement reduces the coupling capacitance between the data line 113 and the pixel electrode 114, thereby decreasing a risk of crosstalk and improving the product quality of the array substrate 100. Due to the opposite polarities of the first-type data line 113*a* and the second-type data line 113*b*, their coupling effects balance each other out, eliminating a need for a DBS (data line BM less) common electrode 130' as shown in FIG. 1, further increasing the aperture ratio of the array substrate 100.

Figure 7:
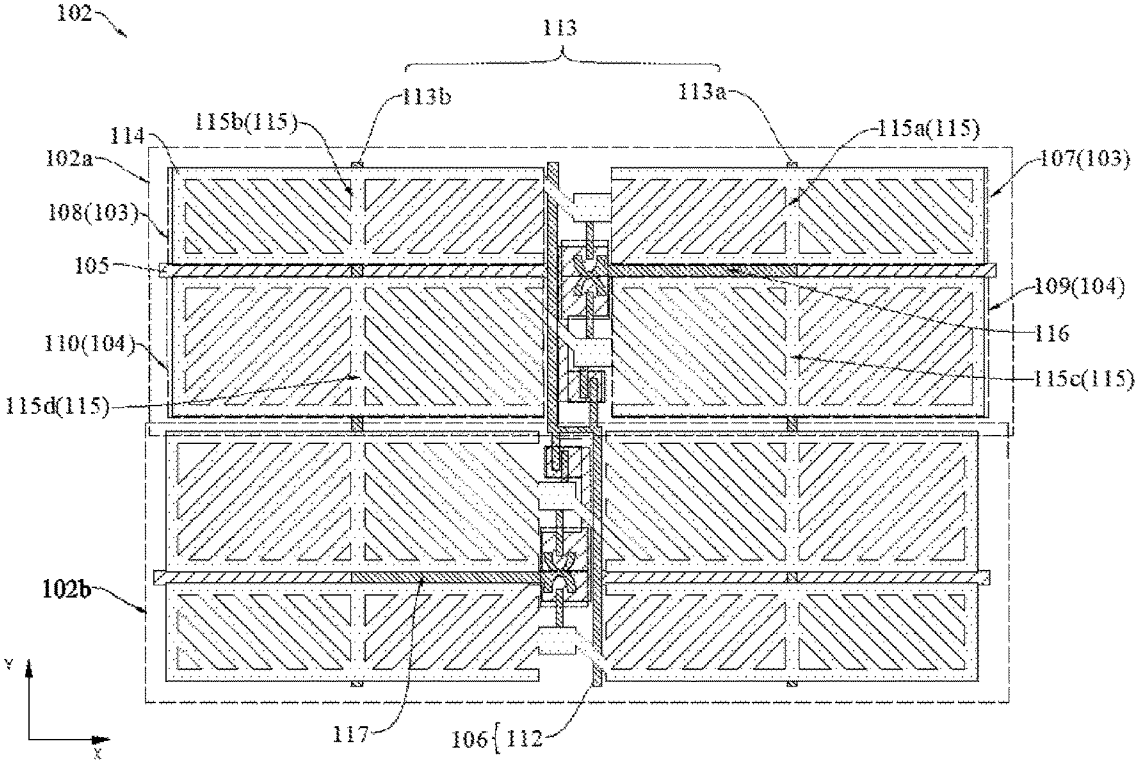
FIG. 7 is a schematic view of a second structure of the pixel unit of the array substrate according to one embodiment of the present disclosure.

Please refer to FIG. 7. In some embodiments, when the first-type data line 113*a* is electrically connected to the first pixel unit 102*a*, and the second-type data line 113*b* is electrically connected to the second pixel unit 102*b*, the array substrate 100 further includes a first-type routing line 116 and a second-type routing line 117. The first-type routing line 116 connects between the first pixel unit 102*a* and the first-type data line 113*a*. The second-type routing line 117 connects between the second pixel unit 102*b* and the second-type data line 113*b*. Specifically, one end of the first-type routing line 116 connects to the source of the first TFT T1 and the source of the second TFT T2 within the first pixel unit 102*a*, and another end of the first-type routing line 116 connects to the first-type data line 113*a*. One end of the second-type routing line 117 connects to the source of the first TFT T1 and the source of the second TFT T2 within the second pixel unit 102*b*, and another end of the second-type routing line 117 connects to the second-type data line 113*b*. The first-type routing line 116 extends along the first direction X and is located between the main pixel region 103 and the sub-pixel region 104. The second-type routing line 117 also extends along the first direction X and is located between the main pixel region 103 and the sub-pixel region 104, which helps avoid occupying additional light-transmissive area of the pixel unit 102 and increases the aperture ratio of the array substrate 100. An orthographic projection of the first-type routing line 116 projected on the base substrate 101 is at least partially within an orthographic projection of the scan line 105 projected on the base substrate 101, and an orthographic projection of the second-type routing line 117 projected on the base substrate 101 is at least partially within an orthographic projection of the scan line 105 projected on the base substrate 101, further helping to avoid occupying additional light-transmissive area of the pixel unit 102 and increasing the aperture ratio of the array substrate 100.

Figure 11:
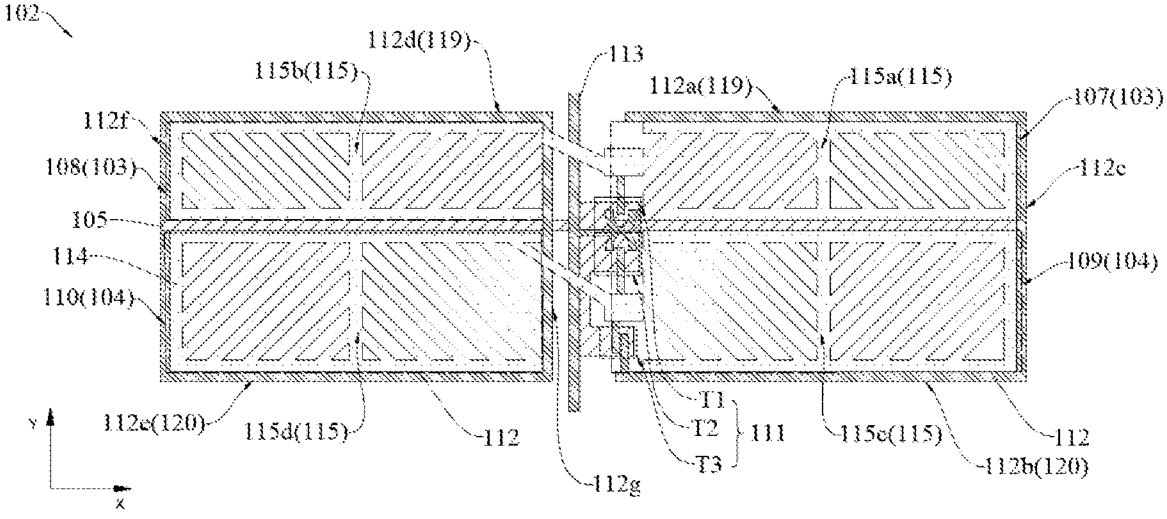
FIG. 11 is a schematic view of a fifth structure of the pixel unit of the array substrate according to one embodiment of the present disclosure.

Referring to FIG. 11, in some embodiments, the first-type signal line 106 is the data line 113, which is located between the first main pixel sub-region 107 and the second main pixel sub-region 108, and also between the first sub-pixel sub-region 109 and the second sub-pixel sub-region 110. This reduces the coupling capacitance between the data line 113 and the pixel electrode 114, thereby enhancing the signal transmission performance of the data line 113. When the data line 113 is located between the first main pixel sub-region 107 and the second main pixel sub-region 108, the pixel units 102 in the same column along the second direction Y are electrically connected to the same data line 113. Each pixel unit 102 includes a first-type signal line 106 disposed between the first main pixel sub-region 107 and the second main pixel sub-region 108. This further reduces the coupling capacitance between the data line 113 and the pixel electrode 114, while also reducing the additional light-transmissive area occupied by the data line 113 on the array substrate 100, thus improving the aperture ratio of the array substrate 100.

In some embodiments, as shown in FIG. 11, the array substrate 100 additionally includes a shared electrode line 112, which is arranged to encircle the pixel unit 102. This shared electrode line 112 transmits a constant voltage signal, creating a potential difference between the main pixel electrode and the sub-pixel electrode. The arrangement of the shared electrode line 112 around the pixel unit 102 generates a stable capacitance between the shared electrode line 112 and the pixel electrode 114, enhancing the storage capacity of the pixel unit 102 and improving the display stability of the display panel using the array substrate 100. In this case, the first-type signal line 106 can be the data line 113.

The shared electrode line 112 includes a first electrode line sub-section 112*a*, a second electrode line sub-section 112*b*, and a third electrode line sub-section 112*c* within each pixel unit 102. The first electrode line sub-section 112*a* and the second electrode line sub-section 112*b* extend along the first direction X, while the third electrode line sub-section 112*c*, connected between the first electrode line sub-section 112*a* and the second electrode line sub-section 112*b*, extends along the second direction Y and is positioned on one side of the first electrode line sub-section 112*a* that is away from the thin-film transistor 111. The first electrode line sub-section 112*a*, the second electrode line sub-section 112*b*, and the third electrode line sub-section 112*c* encircle a periphery of both the first main pixel sub-region 107 and the first sub-pixel sub-region 109. One end of the second electrode line sub-section 112*b*, close to the third thin-film transistor T3, is connected to the drain of the third TFT T3.

The shared electrode line 112 can further include within each pixel unit 102 a fourth electrode line sub-section 112*d*, a fifth electrode line sub-section 112*e*, a sixth electrode line sub-section 112*f*, and a seventh electrode line sub-section 112*g*. The fourth electrode line sub-section 112*d* and the fifth electrode line sub-section 112*e* extend along the first direction X, while the sixth electrode line sub-section 112*f* and the seventh electrode line sub-section 112*g* extend along the second direction Y. The sixth electrode line sub-section 112*f* connects between the fourth electrode line sub-section 112*d* and the fifth electrode line sub-section 112*e*, and the seventh electrode line sub-section 112*g* also connects between the fourth electrode line sub-section 112*d* and the fifth electrode line sub-section 112*e*. The fourth electrode line sub-section 112*d* and the first electrode line sub-section 112*a* are positioned on two opposite sides of the first-type signal line 106, and the fifth electrode line sub-section 112*e* and the second electrode line sub-section 112*b* are positioned on two opposite sides of the first-type signal line 106. Within each pixel unit, the sixth electrode line sub-section 112*f* and the seventh electrode line sub-section 112*g* are located on opposite sides of the main trunk electrode 115 in the second main pixel sub-region. The sixth electrode line sub-section 112*f* is disposed on one side of the thin-film transistor 111 farther from the third electrode line sub-section 112*c*, while the seventh electrode line sub-section 112*g* is disposed on one side of the thin-film transistor 111 closer to the third electrode line sub-section 112*c*. The fourth electrode line sub-section 112*d*, the fifth electrode line sub-section 112*e*, the sixth electrode line sub-section 112*f*, and the seventh electrode line sub-section 112*g* encircle a periphery of the second main pixel sub-region 108 and the second sub-pixel sub-region 110.

Along the first direction X, in the same row of the pixel units 102, each pixel unit's fourth, fifth, sixth, and seventh electrode line sub-sections 112*d*, 112*e*, 112*f*, and 112*g* are interconnected, and are connected through the sixth electrode line sub-section 112*f* to the third sub-section 112*c* of the adjacent pixel unit 102 in the same row. For example, along the first direction X, in the same row of the pixel units 102, the third electrode line sub-section 112*c* in the M-th pixel unit connects to the sixth electrode line sub-section 112*f* in the (M+1)th pixel unit, where M is an integer greater than or equal to 1.

In some embodiments, along the first direction X, in the same row of the pixel units 102, the sixth electrode line sub-section 112*f* within each pixel unit 102 is shared with the third electrode line subsection 112*c* of the adjacent pixel unit 102. This shared arrangement simplifies the fabrication process and improves the aperture ratio of the array substrate 100.

Figure 8:
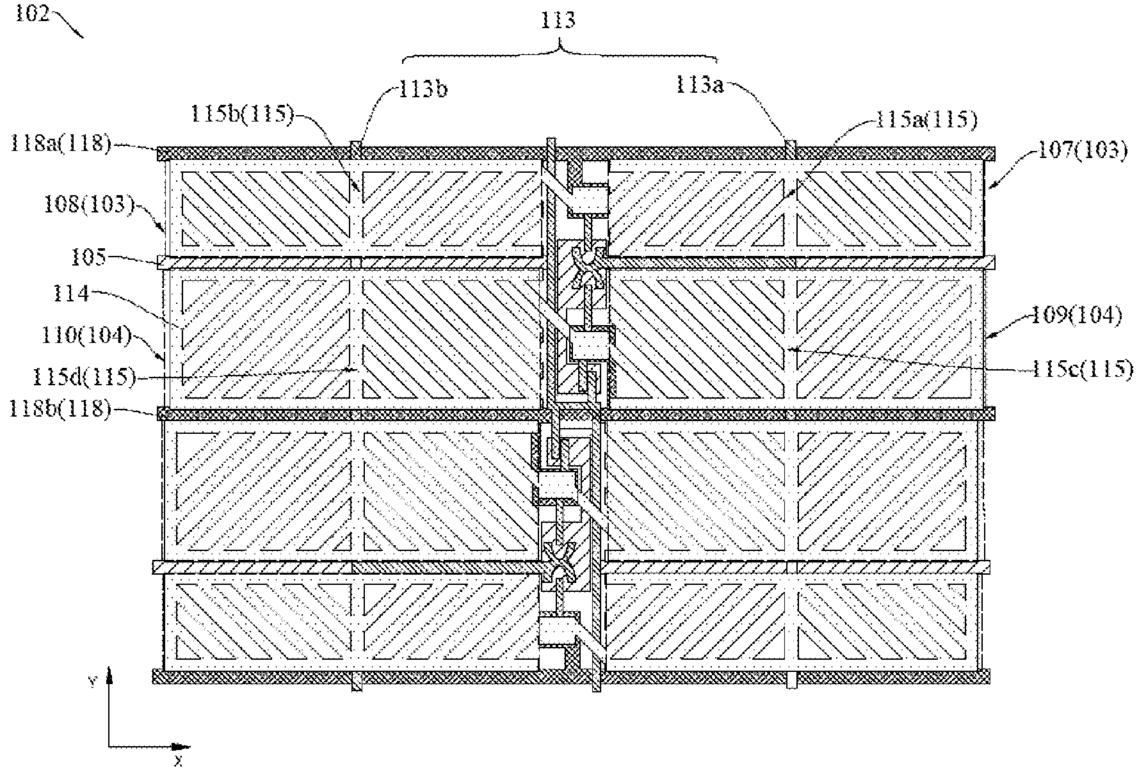
FIG. 8 is a schematic view of a third structure of the pixel unit of the array substrate according to one embodiment of the present disclosure.
Figure 9:
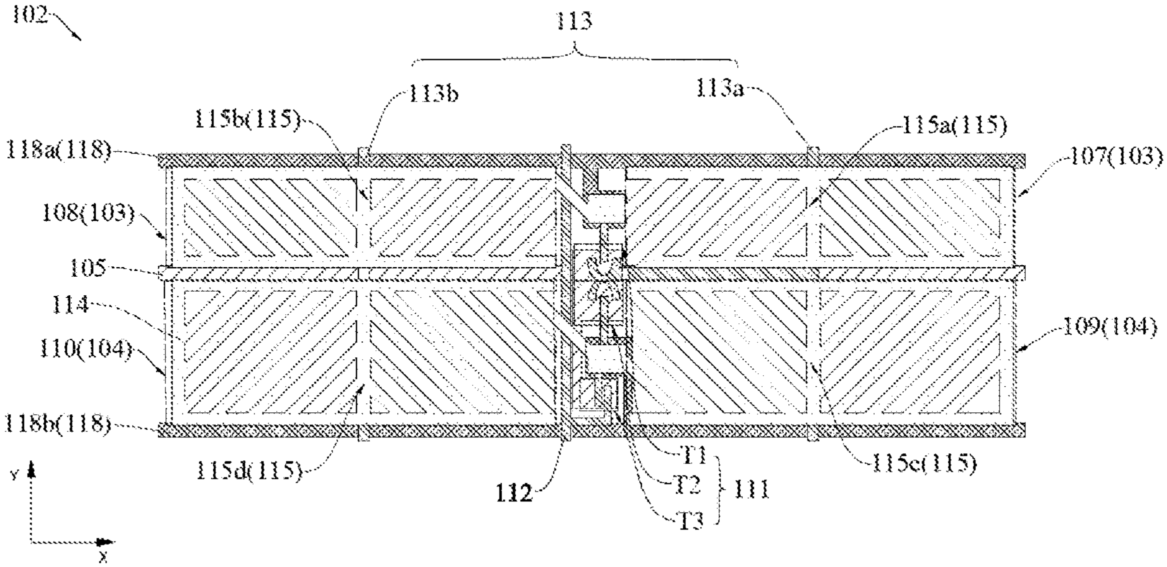
FIG. 9 is a schematic view of a fourth structure of the pixel unit of the array substrate according to one embodiment of the present disclosure.

Please refer to FIGS. 8 and 9. In some embodiments, the array substrate 100 further includes a first common electrode line 118, extending along the first direction X and arranged in the same layer as and spaced apart from the scan line 105. The first common electrode line 118 includes a first sub-part 118*a* and a second sub-part 118*b* arranged along the second direction Y and positioned on opposite sides of the pixel unit 102. The first common electrode line 118 transmits a constant voltage signal, creating a stable capacitance with the pixel electrode 114, enhancing the storage capacitance of the pixel unit 102 and improving the display stability of the display panel using the array substrate 100.

The first sub-part 118*a* is located on the periphery of the first main pixel sub-region 107 and the second main pixel sub-region 108, while the second sub-part 118*b* is around the periphery of the first sub-pixel sub-region 109 and the second sub-pixel sub-region 110. Such configuration prevents excessive occupation of the light-transmissive area of the pixel unit 102, enhancing the aperture ratio of the array substrate 100.

In some embodiments, when the shared electrode line 112 encircles the pixel unit 102, the shared electrode line 112 includes a third sub-part 119 and a fourth sub-part 120, arranged along the second direction Y and extending along the first direction X. The third sub-part 119 and the fourth sub-part 120 are positioned on two opposite sides of the pixel unit 102. An orthographic projection of the third sub-part 119 on the base substrate 101 is at least partially within an orthographic projection of the first sub-part 118*a* on the base substrate 101. An orthographic projection of the fourth sub-part 120 on the base substrate 101 is at least partially within an orthographic projection of the second sub-part 118*b* on the base substrate 101. This configuration aims to minimize occupation of the light-transmissive area of the array substrate 100 while maximizing the storage capacitance of the pixel unit 102, thus enhancing the display stability of the display panel using the array substrate 100. The first electrode line sub-section 112*a* and the fourth electrode line sub-section 112*d* of the shared electrode line 112 constitute the third sub-part 119, while the second electrode line sub-section 112*b* and the fifth electrode line sub-section 112*e* of the shared electrode line 112 constitute the fourth sub-part 120.

Figure 10:
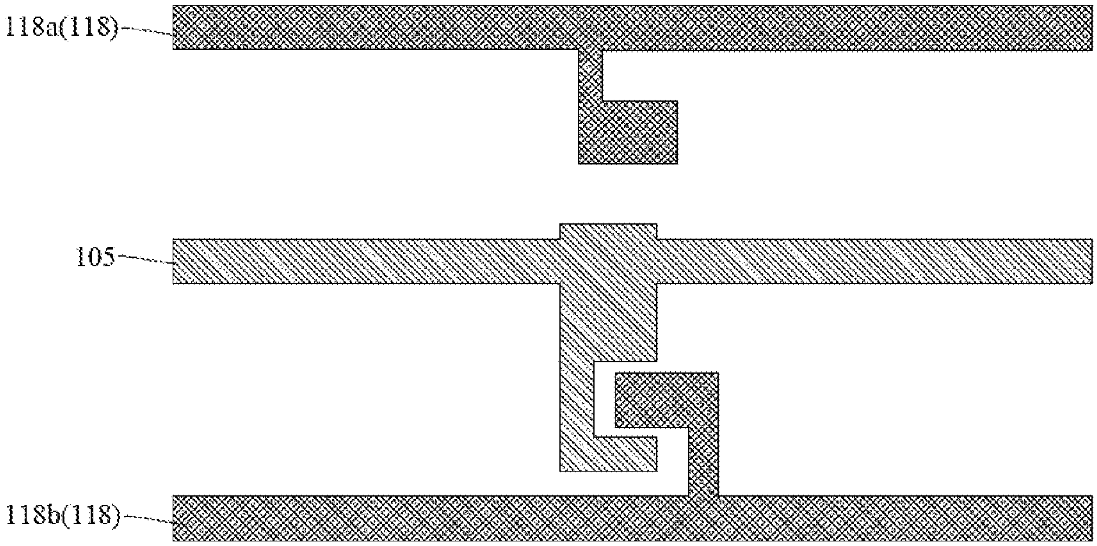
FIG. 10 is a schematic structural view of a second metal layer in the array substrate provided in FIG. 9.

Refer to FIGS. 9 and 10. In some embodiments, the first common electrode line 118 and the scan line 105 can be set in the same layer. The first sub-part 118*a* of the first common electrode line 118 includes a first extension sub-part extending in the second direction Y between the first and second main pixel sub-regions 107 and 108. The second sub-part 118*b* of the first common electrode line 118 includes a second extension sub-part extending in the second direction Y between the first and second sub-pixel sub-regions 109 and 110.

The pixel unit 102 also includes a first pixel electrode connecting part located between the first and second main pixel sub-regions 107 and 108. The first pixel electrode connecting part connects the pixel electrode 114 in the first main pixel sub-region 107 and the pixel electrode 114 in the second main pixel sub-region 108. Similarly, the pixel unit 102 also includes a second pixel electrode connecting part positioned between the first and second sub-pixel sub-regions 109 and 110. The second pixel electrode connecting part connects the pixel electrode 114 in the first sub-pixel sub-region 109 and the pixel electrode 114 in the second sub-pixel sub-region 110. Both the first and second pixel electrode connecting parts are located in the pixel electrode layer 123.

An orthographic projection of the first extension sub-part projected on the base substrate 101 at least partially overlaps with an orthographic projection of the first pixel electrode connecting part projected on the base substrate 101. This overlap is beneficial for increasing the storage capacitance of the pixel unit 102 and improving display stability for the display panel using the array substrate 100. Similarly, an orthographic projection of the second extension sub-part projected on the base substrate 101 partially overlaps with an orthographic projection of the second pixel electrode connecting part.

Please refer to FIG. 10, where the first common electrode line 118 is set apart from the scan line 105, ensuring they do not intersect. This separation prevents short circuits between the first common electrode line 118 and the scan line 105, crucial for maintaining the quality of the display panel utilizing the array substrate 100.

Figure 4:
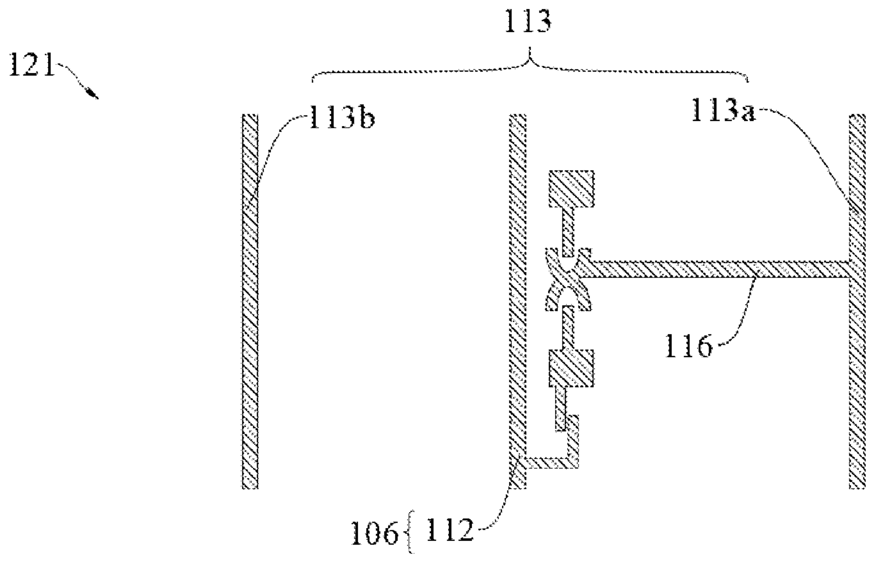
FIG. 4 is a schematic structural view of a first metal layer in the array substrate provided in FIG. 3.
Figure 5:
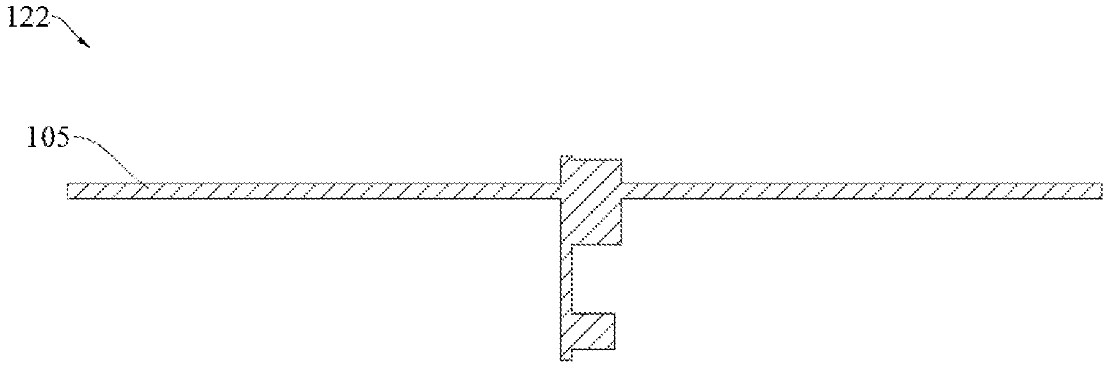
FIG. 5 is a schematic structural view of a second metal layer in the array substrate provided in FIG. 3.
Figure 6:
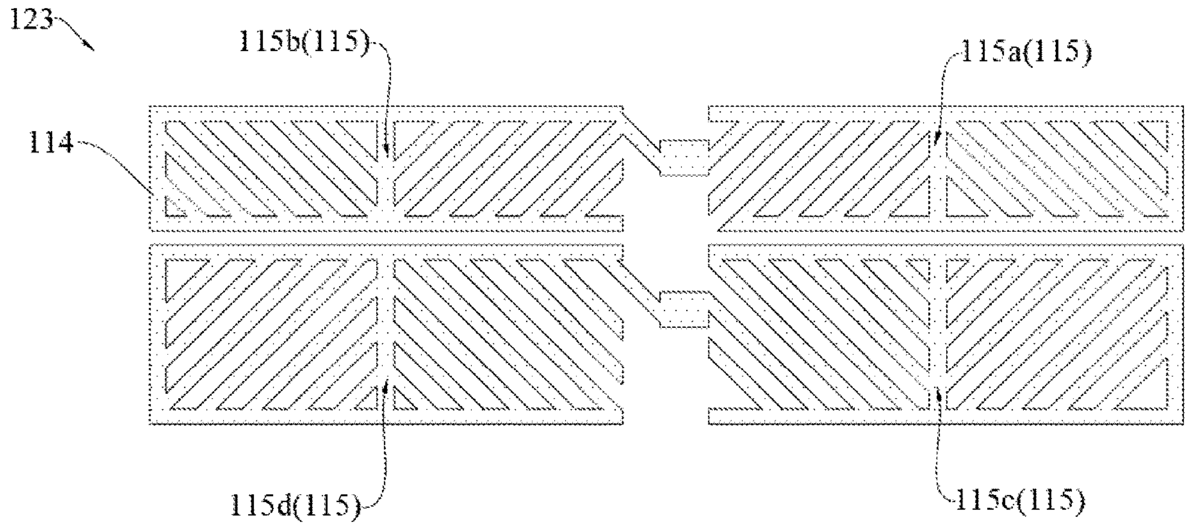
FIG. 6 is a schematic structural view of a pixel electrode layer in the array substrate provided in FIG. 3.

Please refer to FIGS. 4 to 6. In some embodiments, the shared electrode line 112, the data line 113, the source and the drain of the first TFT T1, the source and the drain of the second TFT T2, and the source and the drain of the third TFT T3 are all arranged in the same layer, that is, the first metal layer 121. The scan line 105, the first common electrode line 118, and the gates of the first, second, and third TFTs T1, T2, T3 are disposed in the second metal layer 122. The pixel electrode 114 is in the pixel electrode layer 123, and the first metal layer 121 is positioned between the second metal layer 122 and the pixel electrode layer 123. The array substrate 100 also includes a first via located between the first main pixel sub-region 107 and the second main pixel sub-region 108. The pixel electrode 114 in the first main pixel sub-region 107 and the pixel electrode 114 in the second main pixel sub-region 108 are electrically connected to the drain of the first thin-film transistor T1 through this first via. Similarly, the array substrate 100 also includes a second via located between the first sub-pixel sub-region 109 and the second sub-pixel sub-region 110. The pixel electrode 114 in the first sub-pixel sub-region 109 and the pixel electrode in the second sub-pixel sub-region 110 are electrically connected to the drain of the second thin-film transistor T2 through the second via.

In some embodiments, the scan line 105 and the gates of the first, second, and third TFTs T1, T2, T3 are integrated, simplifying the fabrication process of the array substrate 100 and reducing manufacturing costs.

In some embodiments, the materials for the first metal layer 121 and the second metal layer 122 may include metals, such as alloys or metal materials or laminations of metal materials and other conductive materials.

In some embodiments, the pixel electrode 114 is made from a transparent conductive material, like indium tin oxide (ITO).

In some embodiments, each pixel unit 102 has an eight-domain structure. This includes four domains in the main pixel region 103 and four domains in the sub-pixel region 104. Within the main pixel region 103, there are two domains in the first main pixel sub-region 107 and two domains in the second main pixel sub-region 108. Similarly, within the sub-pixel region 104, there are two domains in the first sub-pixel sub-region 109 and two domains in the second sub-pixel sub-region 110.

Within each pixel unit 102, the first main pixel electrode of the first main pixel sub-region 107 includes the first and second main branch electrodes connected to two ends of the first sub-section 115*a* of the first main trunk electrode 115. The first main branch electrode connects to one end of the first sub-section 115*a* close to the first sub-pixel sub-region 109, and the second main branch electrode connects to one end of the first sub-section 115*a* away from the first sub-pixel sub-region 109. Both the first and second main branch electrodes extend along the first direction X. Additionally, in each pixel unit 102, the first main pixel electrode in the first main pixel sub-region 107 also includes a third main branch electrode connected between the first and second main branch electrodes. The third main branch electrode is positioned on one side of the first sub-section 115*a* away from the thin-film transistor 111. In each pixel unit 102, the first main pixel electrode in the first main pixel sub-region 107 also includes a first branch electrode. This first branch electrode connects between the first sub-section 115*a* and the first main branch electrode, between the first and second main branch electrodes, and between the third and second main branch electrodes. The first branch electrode forms a first angle with the scan line 105. Similarly, in each pixel unit 102, the first main pixel electrode in the first main pixel sub-region 107 further includes a second branch electrode. The second branch electrode connects between the first sub-section 115*a* and the first main branch electrode, between the first and second main branch electrodes, and between the third and second main branch electrodes. The second branch electrode forms a second angle with the first direction X. The first branch electrode and the second branch electrode are symmetrically arranged with respect to the first sub-section 115*a*. When the first angle is 45 degrees, the second angle can be 135 degrees.

In each pixel unit 102, the second main pixel electrode in the second main pixel sub-region 108 includes a fourth main branch electrode and a fifth main branch electrode connected to two ends of the second sub-section 115*b* of the first main trunk electrode 115. The fourth main branch electrode is connected to one end of the second sub-section 115*b* near the second sub-pixel sub-region 110, while the fifth main branch electrode connects to one end of the second sub-section 115*b* away from the second sub-pixel sub-region 110. Both the fourth and fifth main branch electrodes extend along the first direction X. Additionally, in each pixel unit 102, the second main pixel electrode in the second main pixel sub-region 108 includes a sixth main branch electrode connected between the fourth and fifth main branch electrodes. The sixth main branch electrode is located on one side of the second sub-section 115*b* away from the thin-film transistor 111. In each pixel unit 102, the second main pixel electrode in the second main pixel sub-region 108 further includes a third branch electrode. The third branch electrode connects between the second sub-section 115*b* and the fifth main branch electrode, between the fourth and fifth main branch electrodes, and between the sixth and fourth main branch electrodes. The third branch electrode forms a third angle with the scan line 105. Similarly, in each pixel unit 102, the second main pixel electrode in the second main pixel sub-region 108 further includes a fourth branch electrode. The fourth branch electrode connects between the second sub-section 115*b* and the fifth main branch electrode, between the fourth and fifth main branch electrodes, and between the sixth and fourth main branch electrodes. The third branch electrode forms a fourth angle with the scan line 105. The third and fourth branch electrodes are symmetrically positioned with respect to the second sub-section 115*b*. When the third angle is 45 degrees, the fourth angle can be 135 degrees.

In each pixel unit 102, the first sub-pixel electrode in the first sub-pixel sub-region 109 includes a seventh main branch electrode and an eighth main branch electrode connected to two ends of the third sub-section 115*c* of the first main trunk electrode 115. The seventh main branch electrode is connected to one end of the third sub-section 115*c* near the first main pixel sub-region 107, and the eighth main branch electrode is connected to one end of the third sub-section 115*c* away from the first main pixel sub-region 107. Both the seventh and eighth main branch electrodes extend along the first direction X. Additionally, in each pixel unit 102, the first sub-pixel electrode in the first sub-pixel sub-region 109 includes a ninth main branch electrode connected between the seventh and eighth main branch electrodes. The ninth main branch electrode is positioned on one side of the third sub-section 115*c* away from the thin-film transistor 111. In each pixel unit 102, the first sub-pixel electrode in the first sub-pixel sub-region 109 further includes a fifth branch electrode. The fifth branch electrode connects between the third sub-section 115*c* and the seventh main branch electrode, between the seventh main branch electrode and the eighth main branch electrode, and between the eighth main branch electrode and the ninth main branch electrode. The fifth branch electrode forms a fifth angle with the scan line 105. Similarly, in each pixel unit 102, the first sub-pixel electrode in the first sub-pixel sub-region 109 further includes a sixth branch electrode. The sixth branch electrode connects between the third sub-section 115*c* and the seventh main branch electrode, between the seventh main branch electrode and the eighth main branch electrode, and between the eighth main branch electrode and the ninth main branch electrode. The sixth branch electrode forms a sixth angle with the scan line 105. The fifth and sixth branch electrodes are symmetrically arranged with respect to the third sub-section 115*c*. When the fifth angle is 45 degrees, the sixth angle can be 135 degrees.

In each pixel unit 102, the second sub-pixel electrode in the second sub-pixel sub-region 110 includes a tenth main branch electrode and an eleventh main branch electrode connected to two ends of the fourth sub-section 115*d* of the first main trunk electrode 115. The tenth main branch electrode connects one end of the fourth sub-section 115*d* near the second sub-pixel sub-region 110, while the eleventh main branch electrode connects one end of the fourth sub-section 115*d* away from the second sub-pixel sub-region 110. Both the tenth and eleventh main branch electrodes extend along the first direction X. Additionally, in each pixel unit 102, the second sub-pixel electrode in the second sub-pixel sub-region 110 includes a twelfth main branch electrode connected between the tenth and eleventh main branch electrodes. The twelfth main branch electrode is positioned on one side of the fourth sub-section 115*d* away from the thin-film transistor 111. In each pixel unit 102, the second sub-pixel electrode in the second sub-pixel sub-region 110 includes a seventh branch electrode. The seventh branch electrode connects between the fourth sub-section 115*d* and the eleventh main branch electrode, the tenth main branch electrode and the eleventh main branch electrode, and the tenth main branch electrode and the twelfth main branch electrode. The seventh branch electrode forms a seventh angle with the scan line 105. Additionally, in each pixel unit 102, the second sub-pixel electrode in the second sub-pixel sub-region 110 also includes an eighth branch electrode. The eighth branch electrode connects between the fourth sub-section 115*d* and the eleventh main branch electrode, the tenth main branch electrode and the eleventh main branch electrode, and the tenth main branch electrode and the twelfth main branch electrode. The eighth branch electrode forms an eighth angle with the scan line 105. The seventh and eighth branch electrodes are symmetrically arranged with respect to the fourth sub-section 115*d*. When the seventh angle is 45 degrees, the eighth angle can be 135 degrees.

In some embodiments, the first and fifth branch electrodes are located on the same side of the first main trunk electrode 115 in both the first main pixel sub-region 107 and the first sub-pixel sub-region 109. Similarly, the second and sixth branch electrodes are on the same side of the first main trunk electrode 115 in both the first main pixel sub-region 107 and the first sub-pixel sub-region 109. The third and seventh branch electrodes are on the same side of the first main trunk electrode 115 in the second main pixel sub-region 108 and the second sub-pixel sub-region 110. The fourth and eighth branch electrodes are located on the same side of the first main trunk electrode 115 in both the second main pixel sub-region 108 and the second sub-pixel sub-region 110.

In some embodiments, the scan line 105 is positioned between the main pixel region 103 and the sub-pixel region 104. An orthographic projection of the scan line 105 projected on the base substrate 101 is outside an orthographic projection of the pixel electrode 114 projected on the base substrate 101, which helps reduce the coupling capacitance between the scan line 105 and the pixel electrode 114. Alternatively, the orthographic projection of the scan line 105 projected on the base substrate 101 can partially overlap with the orthographic projection of the pixel electrode 114 on the base substrate 101. This design reduces the light-transmissive area occupied by the scan line 105 on the array substrate 100, thereby enhancing the aperture ratio of the array substrate 100.

In some embodiments, the pixel unit 102 includes pixel units of a first color, a second color, and a third color. Along the second direction Y, the pixel unit of the first color, the pixel unit of the second color, and the pixel unit of the third color are arranged in a repeating sequence. The first, second, and third colors are distinct from each other. Along the first direction X, each row of the pixel units 102 consists of pixel units of the same color arranged sequentially. For example, if the N-th row is of the first color (with N being an integer equal to or greater than 1), then the (N+1)th row is of the second color, and the (N+2)th row is of the third color.

In some embodiments, the base substrate 101 is made from materials like glass, polyimide, polycarbonate, polyethylene terephthalate (PET), and polyethylene naphthalate (PEN), either singly or in combination. These materials provide the base substrate with good impact resistance, effectively protecting the array substrate 100.

The disclosed embodiment of the array substrate 100 optimizes light transmission by positioning the scan line 105 between the main pixel region 103 and the sub-pixel region 104, and by setting the first-type signal line 106 and thin-film transistors 111 between the first and second main pixel sub-regions. This reduces the light-blocking area of the signal lines in the array substrate 100, increases the light-transmissive area of pixel unit 102, and enhances the aperture ratio of the array substrate 100, thus improving the transmission rate of the display panel using this substrate.

Figure 12:
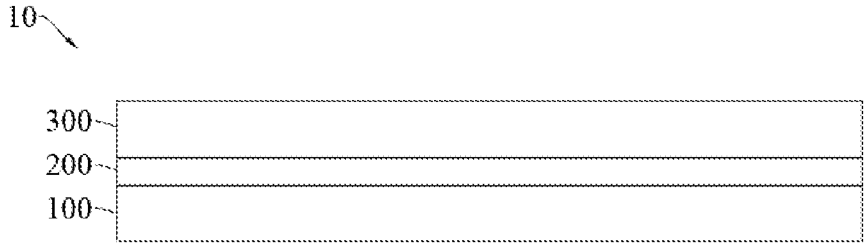
FIG. 12 is a schematic structural view of a display panel according to one embodiment of the present disclosure.

Refer to FIG. 12. An embodiment of the present disclosure provides a display panel 10. The display panel 10 includes any of the previously described array substrates 100.

The specific structure of the array substrate 100 is detailed in the embodiments and accompanying drawings previously mentioned, so a detailed description thereof is not repeated for brevity.

In this embodiment, the display panel 10 can be a liquid crystal display panel. The display panel includes a liquid crystal layer 200 on one side of the array substrate 100, and a color filter substrate 300 on one side of the liquid crystal layer 200 away from the array substrate 100. The liquid crystal layer 200 is positioned on one side of the pixel units 102 of the array substrate 100, away from the base substrate 101.

In some embodiments, the display panel 10 includes a color filter layer. This color filter layer can be positioned on one side of the array substrate 100 close to the liquid crystal layer 200. Alternatively, the color filter layer can be located on one side of the color filter substrate 300 close to the liquid crystal layer 200.

The color filter layer includes color resists of a first color, a second color, and a third color. The color resist of the first color is disposed corresponding to the pixel unit of the first color in the array substrate 100. The color resist of the second color is arranged corresponding to the pixel unit of the second color in the array substrate 100. The color resist of the third color is arranged corresponding to the pixel unit of the third color in the array substrate 100. Such arrangements realize display of images on the display panel. The color resist of the first color, the color resist of the second color, and the color resist of the third color are respectively selected from red color resist, green color resist, and blue color resist. The first, second, and third colors are different from each other.

The present disclosure discloses an array substrate and a display panel. The array substrate includes a base substrate, pixel units, scan lines extending in a first direction, and first-type signal lines extending in a second direction. Each pixel unit includes a main pixel region and a sub-pixel region, along with thin-film transistors. The scan line is positioned between the main pixel region and the sub-pixel region. The first-type signal line and the thin-film transistors are located between a first main pixel sub-region and a second main pixel sub-region. Such configuration reduces occupation of a light-transmissive area by signal lines in the array substrate, enhances an aperture ratio of the array substrate, improves a light transmission rate of the display panel using the array substrate, and lowers manufacturing costs and power consumption.

The above is a detailed introduction to an array substrate and a display panel provided by the present disclosure. Specific examples are used in this disclosure to illustrate the principles and implementation methods of the present disclosure. The description of the above embodiments is only used to help understand the method and the core ideas of the present disclosure. For those skilled in the art, there will be changes in the specific implementation and application scope according to the idea of the present disclosure. In summary, the content of the present disclosure should not be understood as a limitation to the present disclosure.

What is claimed is:

1. An array substrate, comprising:

a base substrate;

a plurality of pixel units disposed on the base substrate, each of the pixel units comprising a pixel electrode located in a main pixel region and a sub-pixel region;

a scan line extending in a first direction, located between the main pixel region and the sub-pixel region; and a first-type signal line extending in a second direction intersecting with the first direction;

wherein the main pixel region comprises a first main pixel sub-region and a second main pixel sub-region arranged along the first direction, the sub-pixel region comprises a first sub-pixel sub-region and a second sub-pixel sub-region arranged along the first direction, the first main pixel sub-region and the first sub-pixel sub-region are arranged along the second direction, and the second main pixel sub-region and the second sub-pixel sub-region are arranged along the second direction;

the first-type signal line is located between the first main pixel sub-region and the second main pixel sub-region; and each pixel unit further comprises multiple thin-film transistors, the thin-film transistors are electrically connected to the scan line and the first-type signal line and located between the first main pixel sub-region and the second main pixel sub-region, the pixel electrode in the first main pixel sub-region and the pixel electrode in the second main pixel sub-region are connected to a same one of the thin-film transistors, and the pixel electrode in the first sub-pixel sub-region and the pixel electrode in the second sub-pixel sub-region are connected to a same one of the thin-film transistors.

2. The array substrate according to claim 1, further comprising a plurality of data lines extending in the second direction, wherein the pixel electrode comprises a first main trunk electrode extending in the second direction, an orthographic projection of the first main trunk electrode projected on the base substrate is at least partially within an orthographic projection of the data lines projected on the base substrate.

3. The array substrate according to claim 2, wherein the first main trunk electrode comprises a first sub-section located in the first main pixel sub-region, a second sub-section located in the second main pixel sub-region, a third sub-section located in the first sub-pixel sub-region, and a fourth sub-section located in the second sub-pixel sub-region;

the data lines comprise a first-type data line and a second-type data line, an orthographic projection of the first sub-section projected on the base substrate is at least partially within an orthographic projection of the first-type data line projected on the base substrate, an orthographic projection of the third sub-section projected on the base substrate is at least partially within the orthographic projection of the first-type data line projected on the base substrate, an orthographic projection of the second sub-section projected on the base substrate is at least partially within an orthographic projection of the second-type data line projected on the base substrate, and an orthographic projection of the fourth sub-section projected on the base substrate is at least partially within the orthographic projection of the second-type data line projected on the base substrate.

4. The array substrate according to claim 3, wherein the pixel units comprise a plurality of first pixel units and a plurality of second pixel units, the first pixel units and the second pixel units are alternately arranged along the second direction, the first pixel units are electrically connected to the first-type data line, the second pixel units are electrically connected to the second-type data line, and the array substrate also comprises a first common electrode line;

wherein a voltage difference between the first-type data line and the first common electrode line is of opposite polarity to a voltage difference between the second-type data line and the first common electrode line.

5. The array substrate according to claim 2, wherein the first-type signal line is a shared electrode line.

6. The array substrate according to claim 2, further comprising a first common electrode line, extending in the first direction, the first common electrode line and the scan line in a same layer and spaced apart, wherein the first common electrode line comprises a first sub-part and a second sub-part arranged along the second direction, and the first sub-part and the second sub-part are respectively located on two opposite sides of the pixel unit.

7. The array substrate according to claim 6, wherein the shared electrode line surrounds the pixel unit, the shared electrode line comprises a third sub-part and a fourth sub-part arranged along the second direction, and the third sub-part and the fourth sub-part extend along the first direction;

wherein the third sub-part and the fourth sub-part are respectively located on two opposite sides of the pixel unit, an orthographic projection of the third sub-part projected on the base substrate is at least partially within an orthographic projection of the first sub-part projected on the base substrate, and an orthographic projection of the fourth sub-part projected on the base substrate is at least partially within an orthographic projection of the second sub-part projected on the base substrate.

8. The array substrate according to claim 6, wherein the shared electrode line surrounds the pixel unit, the shared electrode line comprises a third sub-part and a fourth sub-part arranged along the second direction, and the third sub-part and the fourth sub-part extend along the first direction;

wherein the third sub-part and the fourth sub-part are respectively located on two opposite sides of the pixel unit, an orthographic projection of the third sub-part projected on the base substrate is at least partially within an orthographic projection of the first sub-part projected on the base substrate, and an orthographic projection of the fourth sub-part projected on the base substrate is at least partially within an orthographic projection of the second sub-part projected on the base substrate.

9. The array substrate according to claim 2, wherein in each of the pixel units, the thin-film transistors are located on one side of the first-type signal line close to the first main pixel sub-region, or the thin-film transistors are located on one side of the first-type signal line close to the second main pixel sub-region;

the thin-film transistors comprise a first thin-film transistor, a second thin-film transistor, and a third thin-film transistor;

a gate of the first thin-film transistor is electrically connected to the scan line, a source of the first thin-film transistor is electrically connected to the data line, and a drain of the first thin-film transistor is electrically connected to the pixel electrode in the main pixel region;

a gate of the second thin-film transistor is electrically connected to the scan line, a source of the second thin-film transistor is electrically connected to the data line, and a drain of the second thin-film transistor is electrically connected to the pixel electrode in the sub-pixel region; and a gate of the third thin-film transistor is electrically connected to the scan line, a source of the third thin-film transistor is electrically connected to the drain of the second thin-film transistor, and a drain of the third thin-film transistor is electrically connected to the shared electrode line.

10. The array substrate according to claim 9, wherein the scan line, the gate of the first thin-film transistor, the gate of the second thin-film transistor, and the gate of the third thin-film transistor are integrally formed.

11. The array substrate according to claim 1, further comprising a shared electrode line, wherein the shared electrode line surrounds the pixel unit.

12. A display panel, comprising an array substrate, wherein the array substrate comprises:

a base substrate;

a plurality of pixel units disposed on one side of the base substrate, each of the pixel units comprising a main pixel region and a sub-pixel region, each of the pixel units also comprising a pixel electrode located in the main pixel region and the sub-pixel region;

a scan line extending in a first direction, located between the main pixel region and the sub-pixel region; and a first-type signal line extending in a second direction, the second direction intersecting with the first direction;

wherein the main pixel region comprises a first main pixel sub-region and a second main pixel sub-region arranged along the first direction, the sub-pixel region comprises a first sub-pixel sub-region and a second sub-pixel sub-region arranged along the first direction, the first main pixel sub-region and the first sub-pixel sub-region are arranged along the second direction, and the second main pixel sub-region and the second sub-pixel sub-region are arranged along the second direction;

the first-type signal line is located between the first main pixel sub-region and the second main pixel sub-region; and each pixel unit also comprises multiple thin-film transistors, the thin-film transistors are electrically connected to the scan line and the first-type signal line and located between the first main pixel sub-region and the second main pixel sub-region, the pixel electrode in the first main pixel sub-region and the pixel electrode in the second main pixel sub-region are connected to a same one of the thin-film transistors, and the pixel electrode in the first sub-pixel sub-region and the pixel electrode in the second sub-pixel sub-region are connected to a same one of the thin-film transistors.

13. The display panel according to claim 12, further comprising a plurality of data lines extending in the second direction, wherein the pixel electrode comprises a first main trunk electrode extending in the second direction, an orthographic projection of the first main trunk electrode projected on the base substrate is at least partially within an orthographic projection of the data lines projected on the base substrate.

14. The display panel according to claim 13, wherein the first main trunk electrode comprises a first sub-section located in the first main pixel sub-region, a second sub-section located in the second main pixel sub-region, a third sub-section located in the first sub-pixel sub-region, and a fourth sub-section located in the second sub-pixel sub-region;

the data lines comprise a first-type data line and a second-type data line, an orthographic projection of the first sub-section projected on the base substrate is at least partially within an orthographic projection of the first-type data line projected on the base substrate, an orthographic projection of the third sub-section projected on the base substrate is at least partially within the orthographic projection of the first-type data line projected on the base substrate, an orthographic projection of the second sub-section projected on the base substrate is at least partially within an orthographic projection of the second-type data line projected on the base substrate, and an orthographic projection of the fourth sub-section projected on the base substrate is at least partially within the orthographic projection of the second-type data line projected on the base substrate.

15. The display panel according to claim 14, wherein the pixel units comprise a plurality of first pixel units and a plurality of second pixel units, the first pixel units and the second pixel units are alternately arranged along the second direction, the first pixel units are electrically connected to the first-type data line, the second pixel units are electrically connected to the second-type data line, and the array substrate also comprises a first common electrode line;

wherein a voltage difference between the first-type data line and the first common electrode line is of opposite polarity to a voltage difference between the second-type data line and the first common electrode line.

16. The display panel according to claim 13, wherein the first-type signal line is a shared electrode line.

17. The display panel according to claim 13, further comprising a first common electrode line, extending in the first direction, the first common electrode line and the scan line in a same layer and spaced apart, wherein the first common electrode line comprises a first sub-part and a second sub-part arranged along the second direction, and the first sub-part and the second sub-part are respectively located on two opposite sides of the pixel unit.

18. The display panel according to claim 17, wherein the shared electrode line surrounds the pixel unit, the shared electrode line comprises a third sub-part and a fourth sub-part arranged along the second direction, and the third sub-part and the fourth sub-part extend along the first direction;

wherein the third sub-part and the fourth sub-part are respectively located on two opposite sides of the pixel unit, an orthographic projection of the third sub-part projected on the base substrate is at least partially within an orthographic projection of the first sub-part projected on the base substrate, and an orthographic projection of the fourth sub-part projected on the base substrate is at least partially within an orthographic projection of the second sub-part projected on the base substrate.

19. The display panel according to claim 13, wherein in each of the pixel units, the thin-film transistors are located on one side of the first-type signal line close to the first main pixel sub-region, or the thin-film transistors are located on one side of the first-type signal line close to the second main pixel sub-region;

the thin-film transistors comprise a first thin-film transistor, a second thin-film transistor, and a third thin-film transistor;

a gate of the first thin-film transistor is electrically connected to the scan line, a source of the first thin-film transistor is electrically connected to the data line, and a drain of the first thin-film transistor is electrically connected to the pixel electrode in the main pixel region;

a gate of the second thin-film transistor is electrically connected to the scan line, a source of the second thin-film transistor is electrically connected to the data line, and a drain of the second thin-film transistor is electrically connected to the pixel electrode in the sub-pixel region; and a gate of the third thin-film transistor is electrically connected to the scan line, a source of the third thin-film transistor is electrically connected to the drain of the second thin-film transistor, and a drain of the third thin-film transistor is electrically connected to the shared electrode line.

20. The display panel according to claim 12, further comprising a shared electrode line, wherein the shared electrode line surrounds the pixel unit.

* * * * *